(12) United States Patent
Duclos et al.

(10) Patent No.: US 6,252,257 B1
(45) Date of Patent: *Jun. 26, 2001

(54) ISOLATING WALL BETWEEN POWER COMPONENTS

(75) Inventors: Franck Duclos, Tours; Fabien Rami, Fondettes, both of (FR)

(73) Assignee: SGS-Thomson Microelectronics S.A., Gentilly (FR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/081,051

(22) Filed: May 19, 1998

(30) Foreign Application Priority Data

May 28, 1997 (FR) .................................. 97 06822

(51) Int. Cl.[7] .................................................. H01L 29/74
(52) U.S. Cl. .......................... 257/119; 257/126; 257/500; 257/504; 257/544; 257/524; 257/547; 257/173; 257/154
(58) Field of Search .................................. 257/119, 126, 257/500, 504, 505, 544, 547, 524, 173, 154

(56) References Cited

U.S. PATENT DOCUMENTS

| | | | |
|---|---|---|---|
| 4,063,966 | * 12/1977 | Anthony et al. | 148/1.5 |
| 4,943,835 | * 7/1990 | Yakushiji et al. | 357/23.13 |
| 5,218,224 | * 6/1993 | Taguchi | 257/547 |
| 5,401,984 | * 3/1995 | Byatt et al. | 257/107 |
| 5,828,089 | * 10/1998 | Bernier | 257/173 |

FOREIGN PATENT DOCUMENTS

| | | | |
|---|---|---|---|
| 0721218 | * 7/1996 | (EP) | H01L/27/08 |
| 0 721 218 | 7/1996 | (EP) | H01L/27/08 |

OTHER PUBLICATIONS

Tsutomu Yatsuo et al.: "A Diode Integrated Hishg speed Thyristor" Journal of the Japan Society of Applied Physics 1971 Supplement, vol. 40, Oct. 1971, Tokyo, pp 99–104, Oct 1971.*

French Search Report from French Patent Application No. 97 06822, filed May 28, 1997.

Tsutomu Yatsuo, et al.: "A Diode Integrated High Speed Thyristor" Journal Of The Japan Society Of Applied Physics 1971 Supplement, vol. 40, Oct. 1971, Tokyo, pp 99–104.

* cited by examiner

Primary Examiner—Eddie C. Lee
Assistant Examiner—Matthew E. Warren
(74) Attorney, Agent, or Firm—Wolf, Greenfield & Sacks, P.C.; James H. Morris; Theodore E. Galanthay

(57) ABSTRACT

The present invention relates to an isolating wall for separating elementary components formed in different wells, a component located in at least one of the wells being capable of operating with a high current density. The isolating wall exhibits in its median portion a concentration of carriers higher than $10^{16}$ atoms/cm$^3$. Preferably, the width of the openings from which the dopant diffusions are formed in the upper and lower surfaces of the substrate is higher than 1.3 times the half-thickness of the substrate.

26 Claims, 5 Drawing Sheets

ISOLATING WALL BETWEEN POWER COMPONENTS

BACKGROUND OF THE INVENTION

1. Field of the Invention

The present invention relates to semiconductor power components, that is, components capable of switching high currents and/or having high breakdown voltages.

2. Discussion of the Related Art

Conventionally, power and/or high voltage components were realized in the form of discreet components. Eventually, to ensure the lateral isolation of these components and improve their breakdown voltage, the periphery of the components was formed of an isolating wall formed by deep diffusion of doping atoms from the upper and lower surfaces of a silicon wafer, with a cut being formed in the middle of this isolating wall.

The evolution of techniques has led to manufacturing several power components and especially several vertical components in the same chip. Examples of such structures are described in particular in European patent application EP-A-0721218 which is incorporated herein by reference. In this patent application, as in all descriptions of components formed in wells separated from one another by isolating walls, it is assumed that each of the components formed in a well surrounded by an isolating wall is properly isolated from the adjacent components which do not influence one another.

The applicant has noted that in some structures including several components formed in distinct wells separated by isolating walls, significant current flow can cause parasitic effects on an adjacent component.

SUMMARY OF THE INVENTION

The present invention is based on an analysis of this problem and of its causes and provides means for solving it.

More specifically, the present invention provides an isolating wall structure which has a doping level higher than $10^{16}$ atoms/cm$^3$ at the level of its median portion, at the meeting point of deep diffusions formed from the upper and lower surfaces.

Further, the present invention provides that, preferably, the median portion of the isolating wall has a lateral extent higher than the half-thickness of the wafer in which the deep diffusions are formed.

More specifically, the present invention provides an isolating wall structure for separating elementary components formed in different wells, a component located in at least one of the wells being capable of operating with a high current density, in which the isolating wall exhibits in its median portion a concentration of carriers higher than $10^{16}$ atoms/cm$^3$.

According to an embodiment of the present invention, the width of the openings from which the dopant diffusions are formed in the upper and lower surfaces of the substrate is higher than 1.3 times the half-thickness of the substrate.

The present invention applies to forming a separation between two wells containing vertical triacs.

The present invention applies to separating two wells, one at least of which includes a diode, a thyristor or a vertical triac.

According to an embodiment of the present invention, the various components are of vertical type and the semiconductive chip includes a single rear surface metallization.

The foregoing objects, features and advantages of the present invention, will be discussed in detail in the following non-limiting description of specific embodiments in connection with the accompanying drawings.

DETAILED DESCRIPTION

As is conventional in the field of the representation of semiconductor components, the various cross-sectional views are highly simplified and are not drawn to scale. Those skilled in the art will know how to choose the junction depths and the lateral dimensions of the components according to the desired breakdown voltage and power performances.

Figure 1:
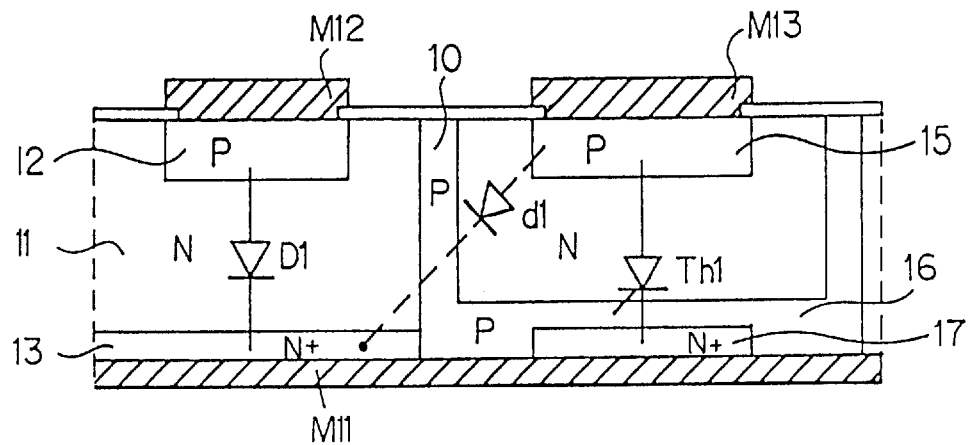
FIGS. 1 to 3 show various component assemblies and are meant to illustrate the problem that the present invention aims at solving.

FIG. 1 shows an example of association of a diode with a common cathode thyristor. This drawing is extremely simplified and only those portions useful for the discussion of the present invention have been shown. In particular, the gate structure of the thyristor has not been shown.

The left-hand portion of FIG. 1 corresponds to a vertical diode D1 and the right-hand portion corresponds to a vertical thyristor Th1 formed in a well separated from the left-hand portion by a P-type isolating wall 10. The structure is formed in an N-type substrate 11. Diode D1 includes a P-type region 12 formed on the upper surface side of the substrate and a heavily-doped N-type region 13 on the lower surface side of the substrate. Thyristor Th1 includes a P-type region 15 formed on the upper surface side of the substrate, a P-type region 16 formed on the lower surface side and an N-type region 17 formed in region 16 on the lower surface side of the substrate. The lower surface of the structure is coated with a cathode metallization M1. Region 12 is coated with an anode metallization M12 of the diode and region 15 is coated with an anode metallization M13 of the thyristor.

The conventional function of isolating wall 10 is to avoid the occurrence of parasitic components. Indeed, in the absence of this isolating wall, there would exist between metallizations M13 and M11 a PNN$^+$ diode d1 formed of regions 15, 11, and 13. This diode d1 would operate as soon as metallization M13 would be positively biased with respect to metallization M11 and would turn on thyristor Th1 in the absence of a gate current. The presence of isolating wall 10 results in interrupting the path in substrate 11 by two series and reversed diodes, one of which is necessarily blocking (non-conducting).

It should be noted that the parasitic effect of diode d1 occurs whatever the biasing of metallization M12 and whatever the current flowing through diode D1. It can thus be said that the isolating wall has a static voltage isolation effect.

Figure 2:
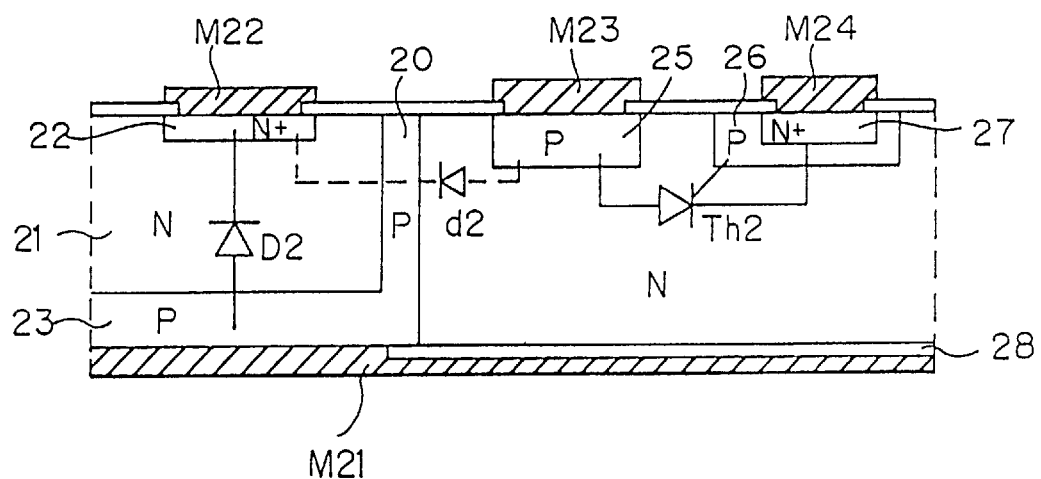

FIG. 2 shows a simplified example of a structure associating a vertical diode D2 with a lateral thyristor Th2. The two components are separated by an isolating wall 20. The structure is formed in an N-type substrate 21. Diode D2 includes on the upper surface side an N-type region 22 and on the lower surface side a P-type region 23. Thyristor Th2 includes on the upper surface side a P-type region 25 and a P-type region 26 in which an N-type region 27 is formed. The N well in which the lateral thyristor is formed is coated on its lower surface side with an isolating layer 28. The lower surface is coated with an anode metallization M21 of the diode. Region 22 is coated with a cathode metallization M22 of the diode. Region 25 is coated with an anode metallization M23 of the lateral thyristor. Region 27 is coated with a cathode metallization M24 of the thyristor.

As in the case of FIG. 1, for clarity, the structure has been simplified and, in particular, the thyristor gate is not shown.

In the absence of an isolating wall 20, there would exist a PNN+ diode d2 between metallizations M23 and M22 and, if the anode M23 of the thyristor is positively biased with respect to metallization M22, the turning-on of the junction between region 25 and substrate 21 would trigger thyristor Th2 in the absence of a gate current.

Here too, the isolating wall is used to avoid the existence of a parasitic diode. Again, the isolating wall has a static voltage protection effect.

Figure 3:
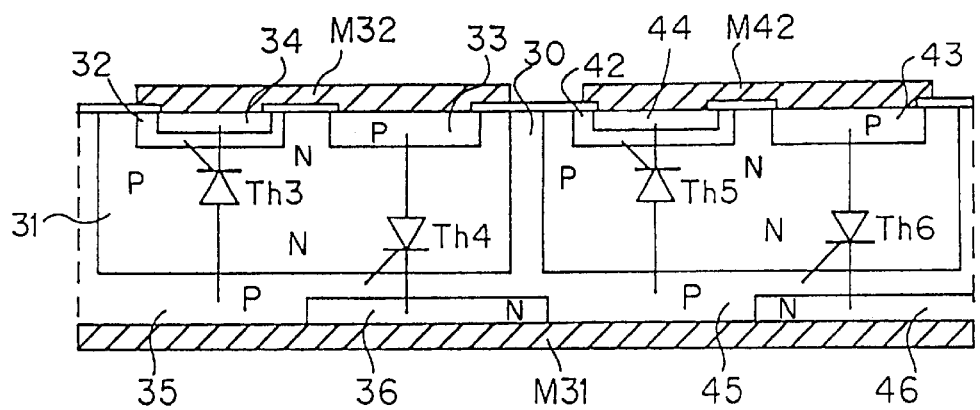

FIG. 3 schematically shows a structure associating side-by-side two triacs separated by an isolating wall 30 and formed in an N-type substrate 31. The left-hand triac includes head-to-tail connected (i.e., the cathode of one thyristor is connected to the anode of another) thyristors Th3 and Th4. The right-hand triac includes head-to-tail connected thyristors Th5 and Th6. On the left-hand side, P-type regions 32 and 33 (shown as separated for a better illustration but often forming one piece) are formed on the upper surface side. In region 32 is formed an N-type region 34. On the rear surface side is formed a P-type region 35 and, in this region 35, facing region 33, an N-type region 36. On the right-hand side of the drawing, regions 42 to 46 respectively correspond to regions 32 to 36. It should be noted that regions 35 and 45 form in fact a single P-type layer. The rear surface is coated with a metallization M31. The cathode region of thyristor Th3 and the anode region of thyristor Th4 are coated with a metallization M32. The cathode region of thyristor Th5 and the anode region of thyristor Th6 are coated with a metallization M42.

In this structure, in the absence of an isolating wall 30, there are no parasitic diodes as in the case of the preceding drawings of parasitic diodes but a great number of parasitic transistors likely to turn on and to turn on one or the other of the triacs in the absence of a gate signal.

Thus, as in the case of the three preceding examples, the isolating wall has a function of static voltage protection of adjacent components. Up to now, this function has been considered satisfactory.

The applicant has noted in the case of the triac assembly of FIG. 3 that, although the operation of the described device is satisfactory in all voltage configurations of the various terminals and during normal operation, incidents sometimes occur when the current in one of the triacs exceeds a given threshold. Similar problems have been acknowledged in the assemblies of FIGS. 1 and 2 and in several monolithic assemblies, some of which are described in European patent application EP-A-0721212. More specifically, in the case of FIG. 1, if a significant current flows through diode D1, a leakage current can appear in the adjacent structure and this current, if sufficiently high, is likely to trigger thyristor Th1; in the case of FIG. 2, if a significant current flows through diode D2, thyristor Th2 is likely to trigger; and in the case of FIG. 3, if a significant current flows through thyristor Th3, thyristor Th5 is likely to trigger.

The present inventors have first searched usual solutions to solve this problem. Thus, they have attempted to interrupt the continuity of layers common to neighboring components but, according to the case, this has revealed to be either impossible or inefficient. Another envisaged solution has been to interrupt the continuity of the lower metallization. But this solution must be discarded since it is one of the central aims of power integrated circuit technology to have a single rear surface electrode.

The present inventors have then questioned the effective efficiency of isolating walls.

Figure 4A:
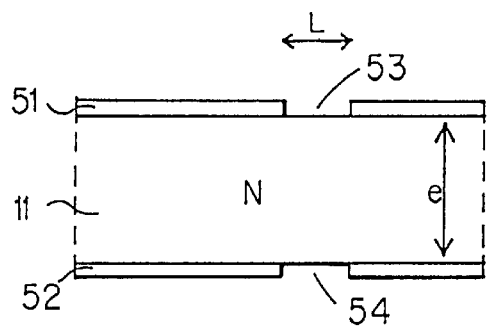
FIGS. 4A and 4B illustrate conventional steps of manufacturing an isolating wall.
Figure 4B:
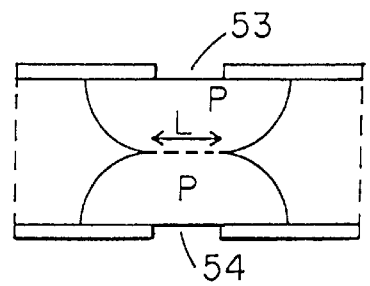

FIGS. 4A and 4B illustrate the conventional method of manufacturing of isolating walls. In a first step, illustrated in FIG. 4A, openings 53 and 54 of width L are defined in masks 51 and 52 formed on the upper and lower surfaces of a substrate 11. Then, either an implantation step is performed to inject a P-type doping in openings 53, 54, followed by an anneal, or an anneal is performed in presence of a doping atmosphere. In both cases, if the silicon wafer has a thickness on the order of 200 to 300 $\mu$m, a very long anneal, for example of some hundred hours, has to be performed so that the dopants extending by diffusion from the lower and upper surfaces join as is shown in FIG. 4B. Of course, the surface doping level is much higher than the doping level at the location where the upper and lower diffusions join, that is, in the median portion of the isolating wall. In order not to unduly increase the duration of the diffusion step, it is generally stopped as soon as the two diffusions join because there is no advantage to prolonging this step. Thus, the dopant concentration at the level of the median portion is generally relatively low, for example, on the order of $10^{15}$ to $10^{16}$ atoms/cm$^3$. The width of the isolating wall in the median portion is then substantially equal to width L of openings 53 and 54. Further, in prior art, it is usually desired to reduce as much as possible the dimension of the isolating walls. Thus, width L is generally chosen to be as small as possible.

Figure 5:
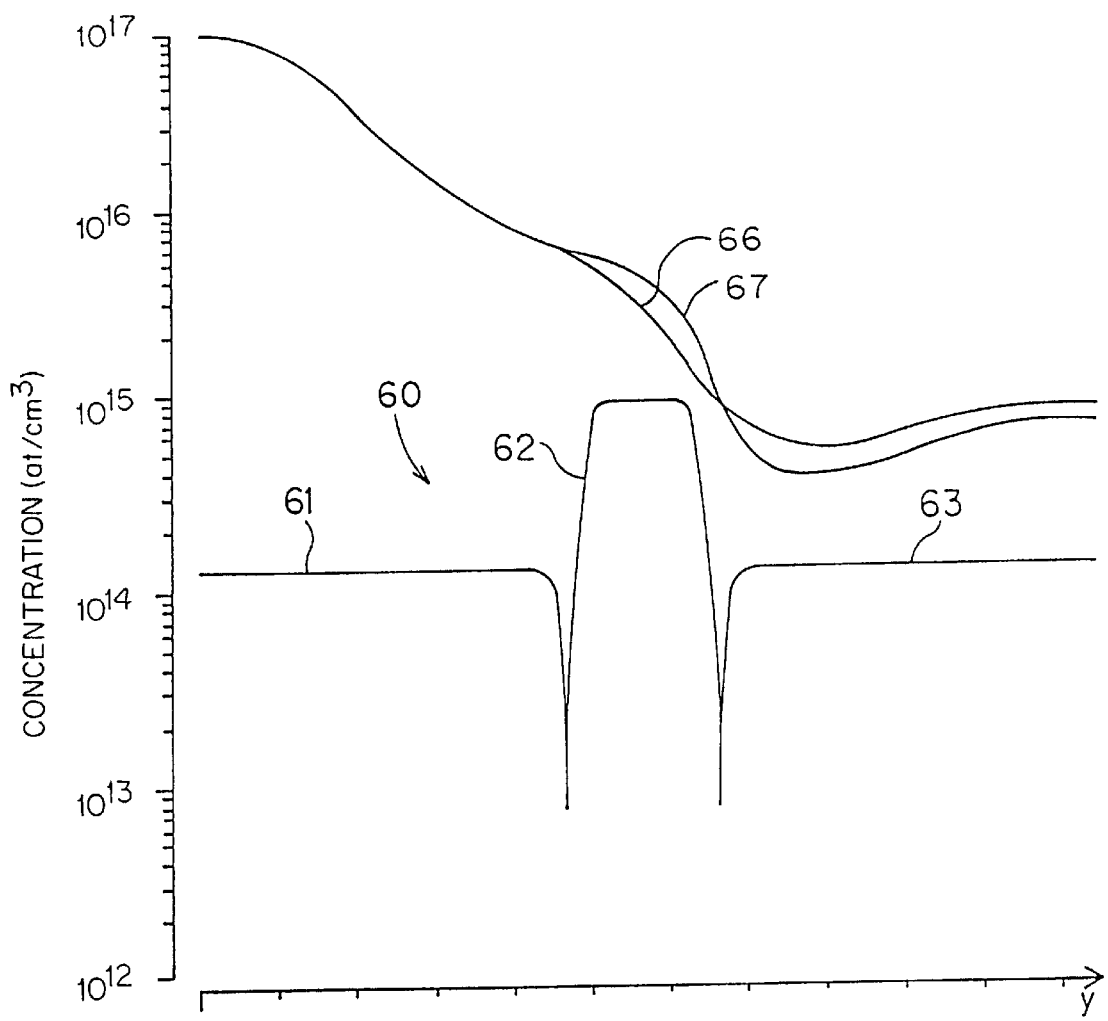
FIG. 5 shows curves of carrier concentration according to the crosswise distance and is meant to show the state of the art.

The present inventors have thought of simulating the electron density in a well containing a power component in the on-state separated, by an isolating wall of the type of that described in relation with FIGS. 4A and 4B, from a well containing a component which is desired to be maintained in the off state. The result of such a simulation is illustrated in FIG. 5. In this drawing, axis y is in a horizontal plane corresponding to a median plane of the structure, that is, cutting the isolating wall in its median region, at the location where both diffusions from the opposite surfaces join. Curve 60 shows the shape of the diffusion profile in this plane. Portions 61 and 63 correspond to the doping of the N-type substrate (of a level on the order of $10^{14}$ atoms/cm$^3$). Portion 62 corresponds to the median region of the isolating wall, the maximum doping level of which can be, as indicated, on the order of $10^{15}$ atoms/cm$^3$.

When the flowing of a current, for example of a 2 A/mm$^2$ density, is simulated in a vertical component located in the left-hand well, curves corresponding to those designated by references 66 and 67 are obtained for the electron and hole density in the median plane of the structure. On the left-hand side, under the active portion of the component, the carrier density is on the order of $10^{17}$ atoms/cm$^3$. The carriers diffuse in the substrate and their density at the level of the isolating wall is higher than the concentration of dopants of this wall. This shows that, as soon as the current density in a well exceeds a certain threshold, its isolating wall is submerged by the created carriers and carriers will diffuse in the adjacent well where they can create disturbances. Generally, if the carrier density in a well becomes excessive due to the conduction of components contained in this well, the carriers will flow into the neighboring well, crossing the isolating wall in its thinner and less doped region. In other words, a statically efficient isolating wall can be dynamically inefficient.

Considering, for example, the structure of FIG. 3, metallization M42 being connected like metallization 32, if a high current flows through thyristor Th3, curves corresponding to those designated by references 66 and 67 are obtained for the electron and hole density. The arrival of electrons in the well containing thyristors Th5 and Th6 makes the junction between P region 45 and substrate 31 conductive, and accordingly turns on thyristor Th5.

Thus, the present invention provides not only creation of isolating walls, but also to form these isolating walls so that their least doped median portion has a sufficient doping level to form a barrier impervious to electron diffusion from a well to a neighboring well.

The optimum concentration of the median area of the isolating wall clearly depends on the carrier concentrations likely to occur in the vicinity of this area However, in practice, when the doping atom concentration at the level of the median portion of the isolating wall is higher than $10^{16}$ atoms/cm$^3$, all problems appear to be avoided in most cases.

According to an alternative of the present invention, the width of the median area of the isolating wall may also be modified.

Figure 6:
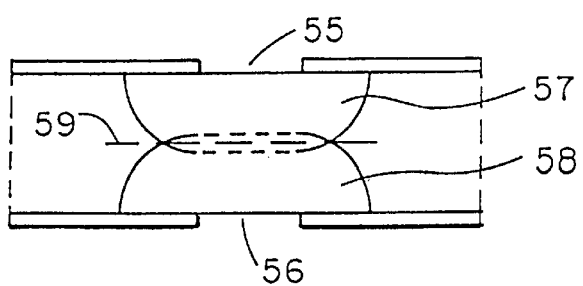
FIG. 6 shows the shape of an isolating wall according to the present invention.

FIG. 6 illustrates an isolating wall formed according to the present invention. This wall is made by pursuing the diffusion of doped areas from openings 55 and 56 so that diffused regions 57 and 58 interpenetrate and the doping level at the level of median line 59 is increased.

The implementation of the present invention implies, for a plate of given thickness, an increase in the duration of the diffusion anneal during the formation of the isolating walls and/or to increase the width of the isolating walls. Preferably, the width of the opening from which the isolating wall is formed will be higher than 1.3 times the substrate half-thickness.

Figure 7:
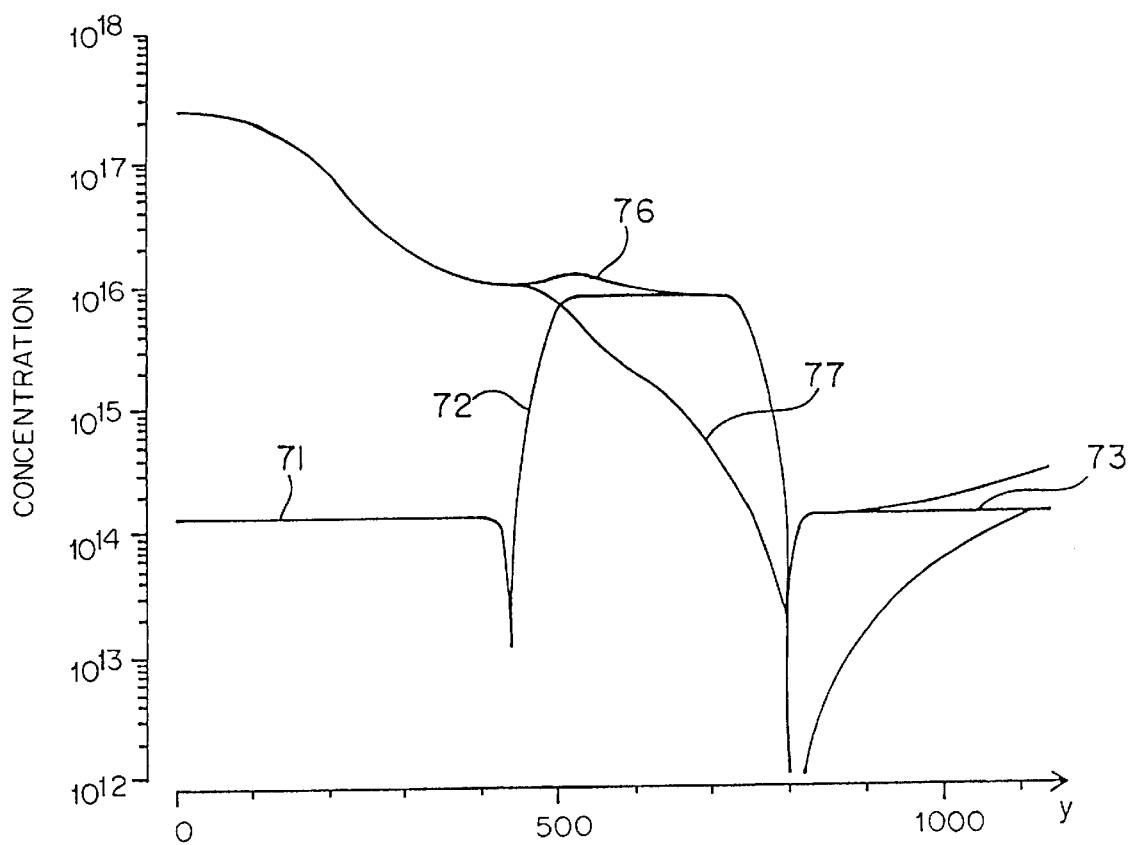
FIGS. 7 and 8 are curves of carrier concentration according to the crosswise distance and are meant to show novel aspects of the present invention.
Figure 8:
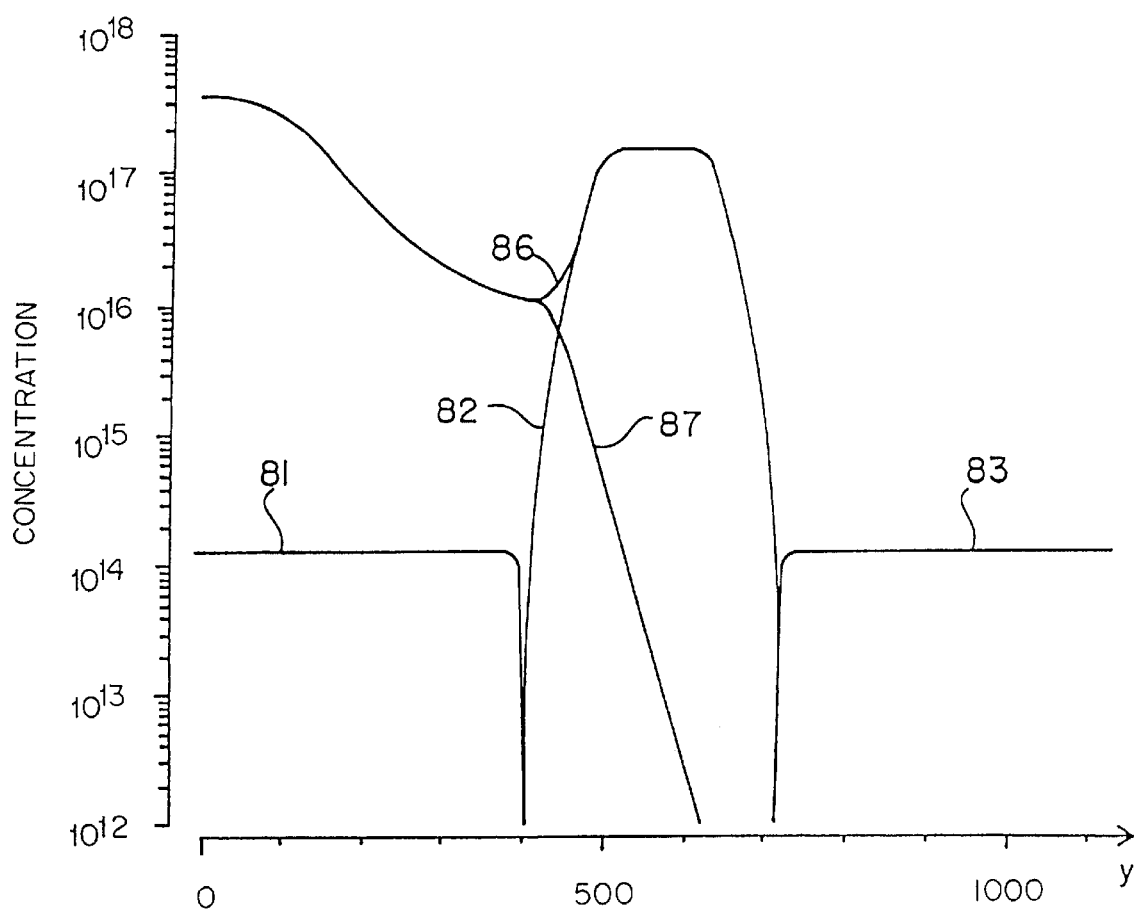

FIGS. 7 and 8 illustrate the effect of isolating walls formed according to the present invention in the same case as that of FIG. 5.

In FIG. 7, the concentration of the isolating wall in its median portion is designated by reference 72. It culminates at approximately $10^{16}$ atoms/cm$^3$. In this drawing, the median portion has a width of approximately 300 $\mu$m and the electron and hole densities are respectively designated by references 77 and 76.

In FIG. 8, the concentration of the isolating wall in its median portion is designated by reference 82. It culminates at approximately $10^{17}$ atoms/cm$^3$. The median portion has a width of approximately 100 $\mu$m. The electron and hole densities are respectively designated by references 86 and 87.

It can be seen that in both cases, the isolating wall is sufficient to avoid electron transmission at the level of wells 71 and 81 in which are created free carriers under the effect of the flowing of a high current at adjacent wells 73 and 83.

Of course, it is also desirable to implement the present invention, to reduce the thickness of the semiconductive wafers from which the components are formed, to reduce the diffusion durations.

Of course, the present invention is likely to have various alterations, modifications, and improvements which will readily occur to those skilled in the art, especially as concerns the nature of the components formed in the wells separated by isolating walls and the number of these wells.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An isolating wall for separating elementary components formed in different wells, a component located in at least one of the wells being capable of operating with a high current density, wherein the isolating wall extends across the thickness of a semiconductor substrate and exhibits in all portions a concentration of carriers higher than $10^{16}$ atoms/cm$^3$; and wherein a width of the openings from which the dopant diffusions are formed in upper and lower surfaces of a substrate is higher than 1.3 times the half-thickness of the substrate.

2. The isolating wall of claim 1, applied to forming a separation between two wells containing vertical triacs.

3. The isolating wall of claim 1, applied to separating two wells, one at least of which includes a diode, a thyristor or a vertical triac.

4. The isolating wall of any of claim 1, wherein the components are of vertical type and the semiconductive chip includes a single rear surface metallization.

5. The isolating wall of claim 1, applied to forming a separation between two wells containing vertical triacs.

6. The isolating wall of claim 1, applied to separating two wells, one at least of which includes a diode, a thyristor or a vertical triac.

7. The isolating wall of claim 1, wherein the isolating wall separates power components formed in different wells.

8. A semiconductor structure comprising:

a semiconductor substrate of a first conductivity type; and an isolating wall of a second conductivity type extending across the thickness of the semiconductor substrate and separating the semiconductor substrate into multiple wells, the isolating wall having a carrier concentration of at least $10^{16}$ atoms/cm$^3$ in all portions; and wherein at least one well includes a component capable of operating at a current density of at least 2 A/mm$^2$.

9. The semiconductor structure of claim 8, wherein the isolating wall comprises an upper diffused region extending from an upper surface of the semiconductor substrate and a lower diffused region extending from a lower surface of the semiconductor substrate.

10. The semiconductor structure of claim 8, wherein the upper diffused region and the lower diffused region intersect in a region that defines a median portion of the isolating wall.

11. The semiconductor structure of claim 8, wherein at least one well includes a power component.

12. The semiconductor structure of claim 8, wherein at least one of the wells includes a component selected from the group consisting of a diode, a thyristor or a vertical triac.

13. The semiconductor structure of claim 8, wherein two of the wells respectively include a component selected from the group consisting of a diode, a thyristor or a vertical triac.

14. The semiconductor structure of claim 8, wherein two of the wells respectively include a vertical triac.

15. The semiconductor structure of claim 8, wherein at least one of the wells includes vertical components.

16. The semiconductor structure of claim 8, further comprising a rear surface metallization.

17. The semiconductor substrate of claim 8, wherein the isolating wall has a minimum carrier concentration of at least $10^{17}$ atoms/cm$^3$.

18. A semiconductor structure comprising:

a semiconductor substrate of a first conductivity type; and an isolating wall of a second conductivity type comprising an upper diffused region extending from an upper surface of the semiconductor substrate and a lower diffused region extending from a lower surface of the semiconductor substrate, the isolating wall separating the semiconductor substrate into multiple wells and having a carrier concentration of at least $10^{16}$ atoms/cm$^3$ in a median portion defined by the overlap of the upper diffused region and the lower diffusion region; and wherein at least one well includes a component capable of operating at a current density of at least 2 A/mm$^2$.

19. The semiconductor structure of claim 18, wherein the upper diffused region and the lower diffused region intersect in a region that defines a median portion of the isolating wall.

20. The semiconductor structure of claim 18, wherein at least one well includes a power component.

21. The semiconductor structure of claim 18, wherein at least one of the wells includes a component selected from the group consisting of a diode, a thyristor or a vertical triac.

22. The semiconductor structure of claim 18, wherein two of the wells respectively include a component selected from the group consisting of a diode, a thyristor or a vertical triac.

23. The semiconductor structure of claim 18, wherein two of the wells respectively include a vertical triac.

24. The semiconductor structure of claim 18, wherein at least one of the wells includes vertical components.

25. The semiconductor structure of claim 18 further comprising a rear surface metallization.

26. The semiconductor substrate of claim 18, wherein the isolating wall has a minimum carrier concentration of at least $10^{17}$ atoms/cm$^3$.

* * * * *